United States Patent [19]

Kobayashi

[11] Patent Number: 4,486,706
[45] Date of Patent: Dec. 4, 1984

[54] POWER FLOW DIRECTION DETECTOR

[75] Inventor: Shunichi Kobayashi, Tokyo, Japan

[73] Assignee: Tokyo Shibaura Denki Kabushiki Kaisha, Japan

[21] Appl. No.: 315,446

[22] Filed: Oct. 27, 1981

[30] Foreign Application Priority Data

Mar. 5, 1981 [JP] Japan .................. 56-030483

[51] Int. Cl.$^3$ .................. G01R 19/14; G01R 21/06
[52] U.S. Cl. .................. 324/133; 324/142; 361/82
[58] Field of Search .................. 324/52, 86, 133, 140, 324/142, 126, 127; 361/79, 80, 82, 85

[56] References Cited

U.S. PATENT DOCUMENTS

| | | | |
|---|---|---|---|
| 2,953,722 | 9/1960 | Willis | 361/85 |
| 3,519,884 | 7/1970 | Paddison et al. | 361/85 |
| 3,700,919 | 10/1972 | Stich | 324/133 X |
| 3,731,190 | 5/1973 | Schwendtner | 324/142 |
| 3,876,886 | 4/1975 | McClain et al. | 361/82 X |
| 3,986,115 | 10/1976 | Huang | 324/133 X |
| 3,986,116 | 10/1976 | Smith et al. | 324/133 X |
| 4,058,768 | 11/1977 | Milkovic | 324/127 X |
| 4,303,881 | 12/1981 | Czerwien et al. | 324/142 |

FOREIGN PATENT DOCUMENTS

| | | |
|---|---|---|
| 2450252 | 5/1976 | Fed. Rep. of Germany . |
| 2337314 | 8/1979 | Fed. Rep. of Germany . |
| 3021003 | 12/1981 | Fed. Rep. of Germany . |
| 51-49430 | 6/1972 | Japan . |

OTHER PUBLICATIONS

Staffin, Robert, 6 Ways to Measure Phase Angle, #6., Zero-Crossing Detection Methods, *Control Engineering*, Oct. 1965, p. 83.
H. P. Khinscha et al., "New Possibilities in Amplitude- —and Phase—Comparison Techniques for Distance Relays," *Proceedings IEE*., vol. 117, No. 11, Nov. 1970.

*Primary Examiner*—Gerard R. Strecker
*Attorney, Agent, or Firm*—Finnegan, Henderson, Farabow, Garrett & Dunner

[57] ABSTRACT

A power flow detector for connection to power supply lines includes a phase difference-to-pulse width converter for producing pulse signals for which the pulse width corresponds to the phase difference between the load voltage and load current of the power supply lines. The output of the phase difference-to-pulse width converter is integrated and the integrated voltage is compared with a reference voltage. The power flow direction is determined by whether the integrated voltage is larger than or smaller than the reference voltage.

1 Claim, 6 Drawing Figures 4,486,706

POWER FLOW DIRECTION DETECTOR

BACKGROUND OF THE INVENTION

This invention relates to power flow detectors for detecting the direction of power flow.

An electric power supply company must continuously monitor conditions of power demand and supply which can change momentarily. They balance the power demand with the power supply, that is, the delivered power with the generated power. To keep a balance between the power demand and supply, power can be delivered from the systems of other companies. If a balance cannot be held otherwise, power is delivered from other companies which makes up for the power shortage. In such cases, the direction of power flow continuously indicates the condition of power demand and supply. The power company must always monitor those conditions to properly operate the electric power system.

In an electric watthour meter using a time sharing multiplier, the output voltage of the multiplier is integrated and the integrated DC voltage is applied to a voltage-to-frequency converter. The output signal of that converter indicates the power being consumed. In a prior art power flow direction detector, an output voltage of an integrator in the voltage-to-frequency converter is detected. In this case, the power is being delivered if the output voltage of the integrator is positive. If it is negative, the power is being returned from other companies.

Since the integrator is composed of an operational amplifier, the offset voltage of the operational amplifier has an affect on the accuracy of the power flow direction.

SUMMARY OF THE INVENTION

It is an object of this invention to provide a power flow detector which can measure the direction of the power flow accurately.

According to this invention, a power flow detector for connection to power supply lines comprises first means for producing first pulse signals which have a pulse width corresponding to the phase of the load voltage across the power supply lines; second means for producing second pulse signals which have a pulse width corresponding to the phase of the load current of the power supply lines; means for converting the phase difference between the respective first and second pulse signals from the first and second means to third pulse signals; a first circuit for integrating the third pulse signals from the converting means; and a second circuit for comparing the output voltage from the first integrating circuit with a predetermined value for producing a signal indicative of the direction of the power flow.

DESCRIPTION OF THE PREFERRED EMBODIMENT

Figure 1:
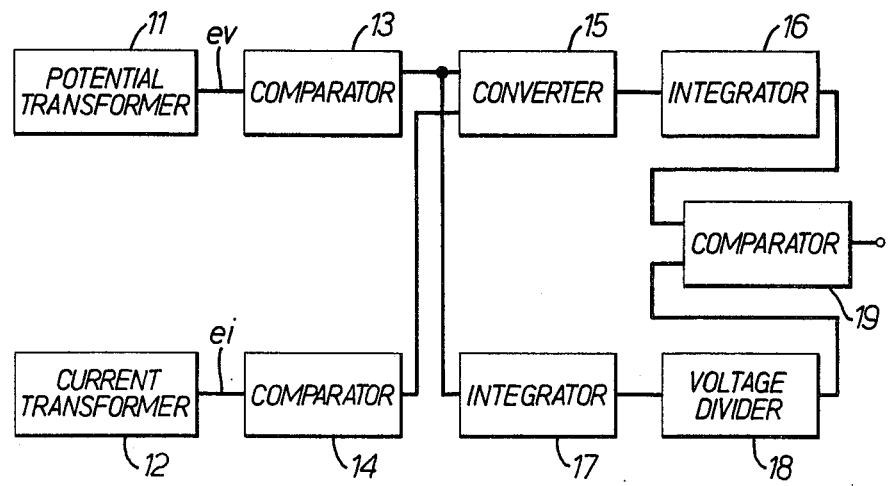
FIG. 1. is a block diagram showing an embodiment according to this invention.

Referring to FIG. 1, the output voltage $e_v$ of a potential transformer 11 is proportional to the load voltage across power supply lines, the transformer 11 being connected to the power supply lines. An output voltage $e_i$ of a current transformer 12, also connected to the power supply lines, is proportional to the load current on the power supply lines. The power supply lines are not shown in FIG. 1. Comparator circuits 13, 14 convert the voltage signals $e_v$ and $e_i$ to respective pulse signals which correspond in phase, that is as shown in FIGS. 3(a) and 3(b) the zero-crossing points for the respective voltage and current signals are the same.

Figure 3:
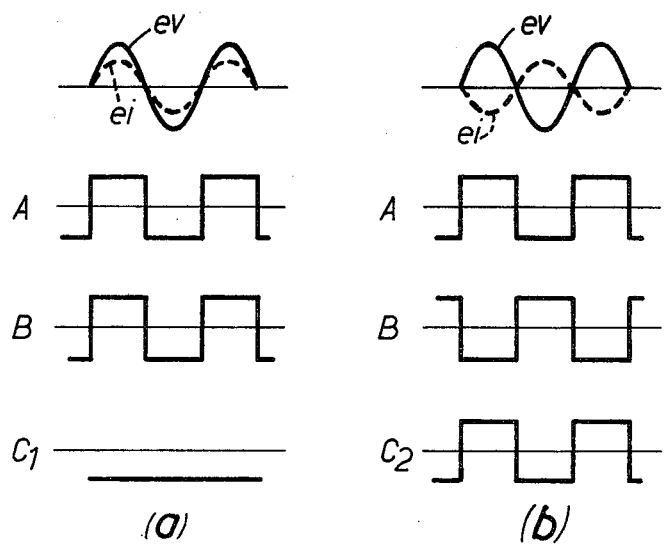
FIGS. 3, 4 and 5 are waveform diagrams for explaining the operation of this invention.

A phase difference-to-pulse width converter 15 compares the voltage of the comparator circuits 13 and 14 and produces pulse signals responsive to the comparison. A first integrator circuit 16 integrates the output signal of the phase difference-to-pulse width converter 15. A second integrator circuit 17 integrates the output signal of the comparator circuit 13 as shown in FIG. 3 which signal always has a pulse width of 180° since the output signal is sinusoidal. A voltage divider circuit 18 divides the output voltage of the second integrator circuit 17 into, for example, a voltage corresponding with a pulse width of 90° assuming the voltage divider circuit 18 divides the voltage in half. That is, the output voltage level of the voltage divider circuit 18 will correspond to a pulse width of 90°. A comparator circuit 19 compares the output voltage of the voltage divider circuit 18 with that of integrator 16. When the output voltage of the first integrator circuit 16 is larger than the output voltage of the voltage divider circuit 18, the comparator circuit 19 produces a pulse signal. As described hereinafter, when the comparator circuit 19 produces the pulse signal, the direction of the power flow is determined to be "returned".

Figure 2:
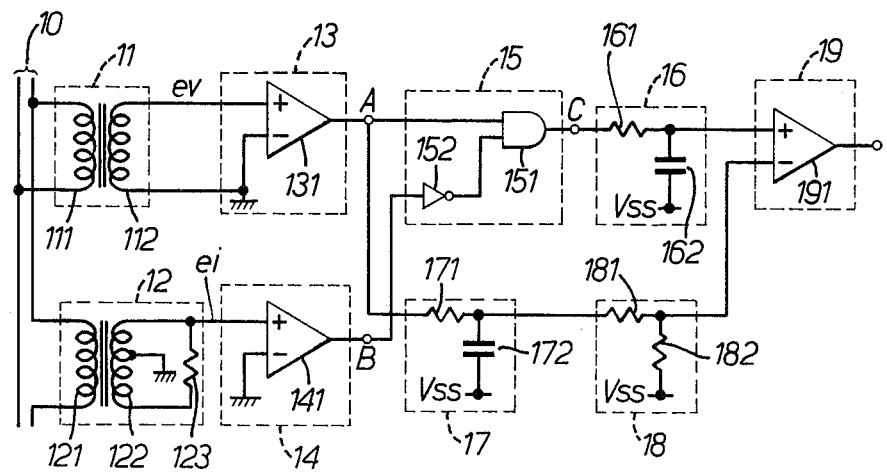
FIG. 2 is a detailed circuit diagram of FIG. 1.

Referring to FIG. 2, a primary winding 111 of the potential transformer 11 is connected across power supply lines 10. The voltage $e_v$ of a secondary winding 112 is proportional to the load voltage of the power supply lines 10. A primary winding 121 of the current transformer 12 is connected to the power supply lines 10. The current in a secondary winding 122 is proportional to the load current and is converted to a voltage $e_i$ across resistor 123. A center tap of the secondary winding 122 is grounded.

The comparator circuit 13 is composed of operational amplifier 131. The positive input of amplifier 131 is connected to one terminal of the secondary winding 112 of the potential transformer 11. The negative input of amplifier 131 is connected to the other terminal of the secondary winding 112 and is grounded. The comparator circuit 13 converts the output voltage $e_v$ of the potential transformer 11 to pulse signals with the same phase as voltage $e_v$.

The comparator circuit 14 is composed of operational amplifier 141. The positive input of amplifier 141 is connected to one terminal of the secondary winding 122 of the current transformer 12 and the negative input of amplifier 141 is grounded. The comparator circuit 14 converts the output voltage $e_i$ to pulse signals in accordance with the phase of voltage $e_i$.

The phase difference-to-pulse width converter 15 includes an AND gate 151 and an inverter gate 152. One terminal of the AND gate 151 is connected to the output of comparator circuit 13. The other terminal of the AND gate 151 is connected to the output of the comparator circuit 14 through inverter gate 152. The phase difference-to-pulse width converter 15 produces pulse signals which correspond to the phase difference between the voltage signal $e_v$ and the inverted voltage $e_i$ of inverter gate 152.

A first integrator circuit 16 includes a resistor 161 and a capacitor 162. One terminal of the resistor 161 is connected to the output of AND gate 151 and the other terminal is connected to a terminal of the capacitor 162. The other terminal of capacitor 162 is connected to a negative power supply source $V_{ss}$. The first integrator circuit 16 integrates the output signal of the phase difference-to-pulse width converter 15.

A second integrator circuit 17 includes a resistor 171 and a capacitor 172. One terminal of the resistor 171 is connected to the output of comparator 13 and the other is connected to a terminal of capacitor 172. The other terminal of the capacitor 172 is connected to the negative power supply source $V_{ss}$. The second integrator circuit 17 integrates the output signal of the comparator 13 which has a pulse width of 180°.

A voltage divider circuit 18 includes resistors 181 and 182. One terminal of resistor 181 is connected to resistor 171, that is, the output of integrator 17, and the other is connected to a terminal of resistor 182. The other terminal of the resistor 182 is connected to the negative power supply source $V_{ss}$. In this embodiment, the resistance of resistor 181 is chosen equal to that of resistor 182. It will be understood that other resistance values can be chosen. In this case, the output voltage of the voltage divider circuit 18 is half of the output voltage of the integrator circuit 17. That is, the output voltage of the voltage divider circuit 18 is an integrated voltage of the pulse width which is representative of a 90° phase.

The comparator circuit 19 is composed of an operational amplifier 191. The positive input of amplifier 191 is connected to the output of the first integrator circuit 16 and the negative input is connected to the output of the voltage divider circuit 18. When the output voltage of integrator circuit 16 is larger than the output voltage of the voltage divider circuit 18, the comparator circuit 19 produces a pulse signal output. In this embodiment, if the output voltage of integrator circuit 16 is larger than the integrated voltage of the pulse width corresponding to the phase 90°, the comparator circuit 19 produces the output pulse signal.

Figure 4:
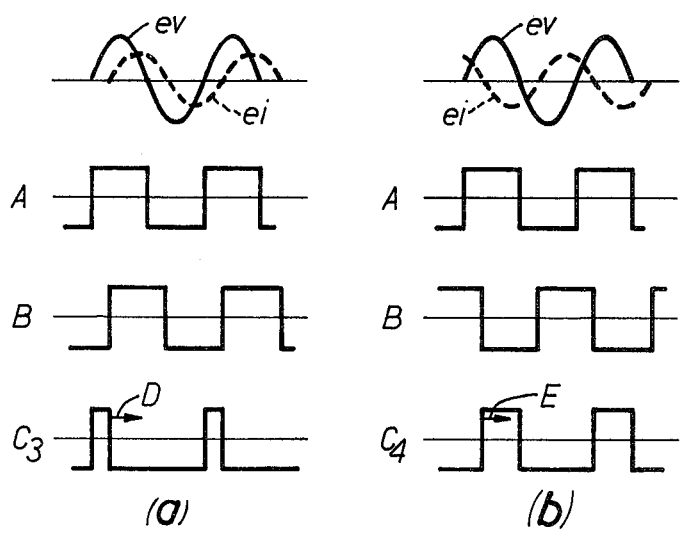
Figure 5:
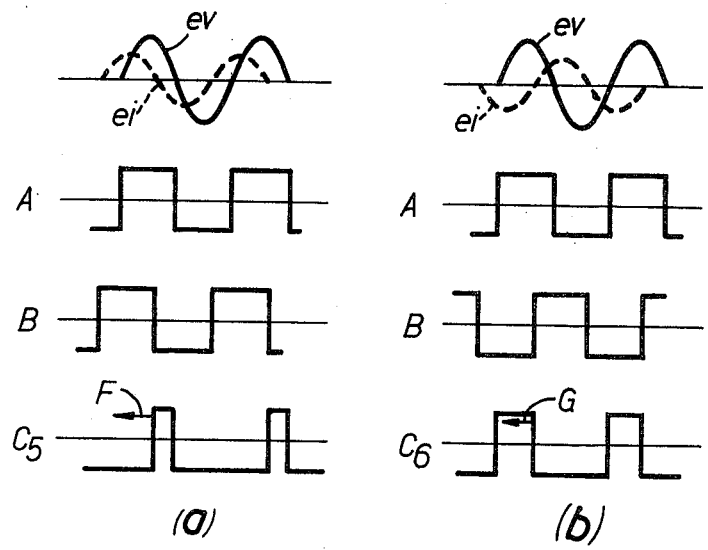
Figure 6:
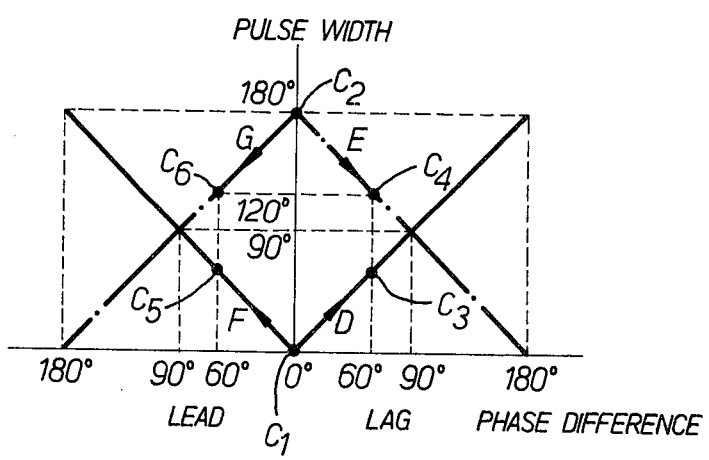
FIG. 6 is a graph for explaining the operation of this invention.

FIGS. 3 to 5 are waveform diagrams for explaining the operation of this embodiment. In FIGS. 3 to 5, (a) is the condition that the power is being delivered and (b) is the condition that power is being returned. A, B and C in FIGS. 3 to 5 are the voltage waveforms corresponding to the voltages at A, B and C in FIG. 2. FIG. 6 shows the relationship between the output voltage of the phase difference-to-pulse width converter and the phase difference between the voltages $e_v$ and $e_i$. Solid lines show the "delivered" power condition and dashed lines show the "returned" power condition. Subscripts 1 to 6 for C in FIGS. 3 to 5 correspond to C1 to C6 in FIG. 6. Arrows D, E, F and G in FIGS. 3, 4 and 5 correspond to arrows D, E, F and G in FIG. 6.

FIG. 3(a) is the condition that there is no phase difference between the respective voltage signals $e_v$ and $e_i$. $e_v$ is shown by solid lines and $e_i$ is shown by broken lines. The voltage signals $e_v$ and $e_i$ are converted to pulse waveforms by the comparators 13 and 14 as shown in FIG. 3(a) A and B, respectively. The waveform B is inverted by the inverter circuit 152, and the inverted waveform and the waveform of A are applied to the AND gate 151. The output of the AND gate 151 is zero. That is, the output signal of the AND gate is that the phase difference between $e_v$ and $e_i$ is 0°, and is shown as C1 in FIG. 6. The condition shown in FIG. 3(b) is 180° phase difference between $e_v$ and $e_i$ and the output pulse signal of the converter 15 has a positive pulse width of 180°, and is shown as C2 in FIG. 6.

FIG. 4(a) is the condition that there is a 60° lag between the voltage signals $e_v$ and $e_i$. This is shown as C3 in FIG. 6. As the phase difference (lag) becomes larger, the pulse width becomes larger shown as arrow D in FIG. 4(a). FIG. 4(b) is shown as C4 in FIG. 6. As the phase difference (lag) becomes larger, the pulse width becomes smaller shown as arrow E in FIG. 4(b).

FIGS. 5(a) and (b) are the conditions that there is 60° phase difference between the voltage signals $e_v$ and $e_i$. These are shown as C5 and C6 in FIG. 6. The pulse width becomes larger or smaller shown as arrows F or G respectively.

Referring to FIG. 6, the phase difference between the voltage signals $e_v$ and $e_i$ is normally less than 90° though the phase may be leading or lagging. Accordingly, the power is returned if the pulse width is larger than 90°. That is, the condition is determined as "returned" power when the output of the phase difference-to-pulse width converter 15 is larger than the pulse width 90°. Actually, the phase difference (lag or lead) between the voltage signals $e_v$ and $e_i$ is considered as equal or less than 60°.

In the "delivered" power condition shown in FIG. 3(a), the output of the phase difference-to-pulse width converter 15 is zero and the output of the first integrator circuit 16 is also zero. On the other hand, the second integrator circuit 17 integrates the pulse at point A which has a pulse width of 180°. The voltage divider circuit 18 divides the output of the second integrator circuit 17 into a integrated voltage representative of a signal having a pulse width 90°. The comparator circuit 19 compares the output of the first integrator circuit 16 with the output of the voltage divider circuit 18. Consequently, the output of the comparator circuit 19 is zero. In this case, the condition shown in FIG. 3(a) is determined as "delivered" power because the output of the comparator circuit 19 is zero.

Similarly, the conditions shown as C2 to C6 are determined as the "delivered" or "returned" power conditions. For instance in the case of FIG. 4(b), the output of the phase difference-to-pulse width converter 15 is the pulse width 120°. Referring to FIG. 4(b), the phase difference between $e_v$ and $e_i$ is, for example, 60° (lagging). The output signal of the converter 15 has the pulse width ($180° - 60° = 120°$) of the positive half wave. The first integrator circuit 16 integrates the pulse signal corresponding to the pulse width 120°. The comparator circuit 19 compares the output of the first integrator circuit 16 with the output of the voltage divider circuit 18 and produces the pulse signal shown as the "returned" power condition.

If the phase difference between the voltage signals $e_v$ and $e_i$ is equal or less than 60°, the output of the voltage divider circuit 18 will be the pulse width corresponding to 120° as shown in FIG. 6.

The comparator composed of an operational amplifier has an offset voltage, but the offset voltage has no influence on the accuracy of the power flow detector. Accordingly, the offset voltage of the operational amplifier has no influence on the accuracy of the power flow detector because the integrator circuit is not composed of an operational amplifer.

What is claimed is:

1. A power flow direction detector for connection to power supply lines to detect delivered or returned power conditions comprising:

first means for producing first pulse signals which have a pulse width representative of the phase of the load voltage across the power supply lines, the polarity of said first pulse signals corresponding to the polarity of said load voltage;

second means for producing second pulse signals which have a pulse width representative of the phase of the load current of the power supply lines, the polarity of said second pulse signals corresponding to the polarity of said load current;

means for converting the phase difference between the respective first and second pulse signals from said first and second means to third pulse signals;

a first circuit for integrating said third pulse signals from said converting means;

a second circuit for integrating said first pulse signals from said first means;

a third circuit for dividing the output voltage from said second circuit into a voltage signal of a fixed level; and a fourth circuit for comparing the output voltage from said first integrating circuit with the fixed value signal from said third circuit for producing a signal indicative of the direction of the power flow which shows a delivered or returned power condition when the output voltage from said first integrating circuit is respectively smaller or greater than the voltage signal of a fixed level.

* * * * *